United States Patent
Watanabe

[19]

[11] Patent Number: 6,150,879
[45] Date of Patent: Nov. 21, 2000

[54] SEMICONDUCTOR APPARATUS FOR USE IN LOW VOLTAGE POWER SUPPLY

[75] Inventor: Daita Watanabe, Yamagata, Japan

[73] Assignee: NEC Corporation, Tokyo, Japan

[21] Appl. No.: 09/154,713

[22] Filed: Sep. 17, 1998

[30] Foreign Application Priority Data

Sep. 22, 1997 [JP] Japan .................................. 9-256997

[51] Int. Cl.$^7$ .................................................. H03K 7/162
[52] U.S. Cl. ........................ 327/589; 327/147; 327/156; 327/536
[58] Field of Search .................... 327/147, 148, 327/156, 157, 390, 536, 589, 544, 545; 326/88

[56] References Cited

U.S. PATENT DOCUMENTS

| | | | |
|---|---|---|---|
| 5,394,027 | 2/1995 | Park | 327/536 |
| 5,488,327 | 1/1996 | Okada | 327/536 |
| 6,009,139 | 12/1999 | Austin et al. | 327/47 |

FOREIGN PATENT DOCUMENTS

| | | |
|---|---|---|
| 55-148245 | 4/1954 | Japan . |
| 59-64928 | 4/1984 | Japan . |
| 62-1322 | 1/1987 | Japan . |
| 1-120132 | 5/1989 | Japan . |
| 1-282926 | 11/1989 | Japan . |
| 3-118758 | 5/1991 | Japan . |
| 4-167815 | 6/1992 | Japan . |
| 4-200015 | 7/1992 | Japan . |
| 6-311731 | 11/1994 | Japan . |
| 7-194095 | 7/1995 | Japan . |
| 7-334257 | 12/1995 | Japan . |
| 8-9071 | 1/1996 | Japan . |
| 8-102667 | 4/1996 | Japan . |
| 10-270999 | 10/1998 | Japan . |

*Primary Examiner*—Terry D. Cunningham
*Assistant Examiner*—Quan Tra
*Attorney, Agent, or Firm*—Young & Thompson

[57] ABSTRACT

A semiconductor apparatus for use with a low voltage power supply includes an internal circuit that operates in synchronization with a first clock signal that is input from an external terminal or generated by a clock generating circuit, a voltage raising circuit for raising a power supply voltage in synchronization with a second clock signal whose pulse edge does not overlap with that of the first clock signal, and a constant voltage circuit for inputting an output voltage of the voltage raising circuit and supplying a constant voltage as a power supply voltage to the internal circuit.

35 Claims, 12 Drawing Sheets

F I G. 12(a)
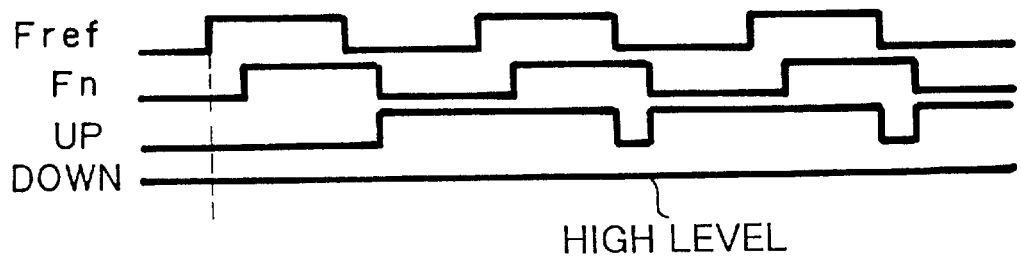
HIGH LEVEL
F I G. 12(b)
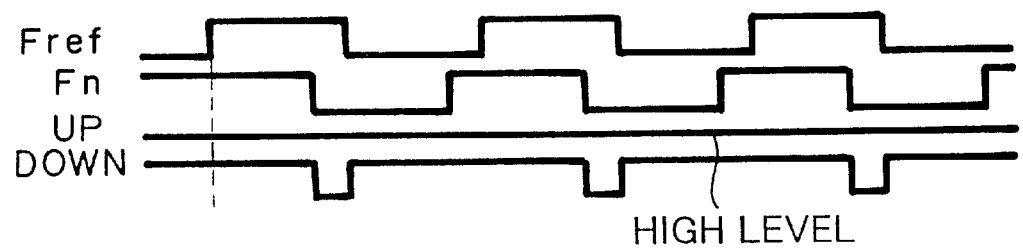
HIGH LEVEL
F I G. 12(c)
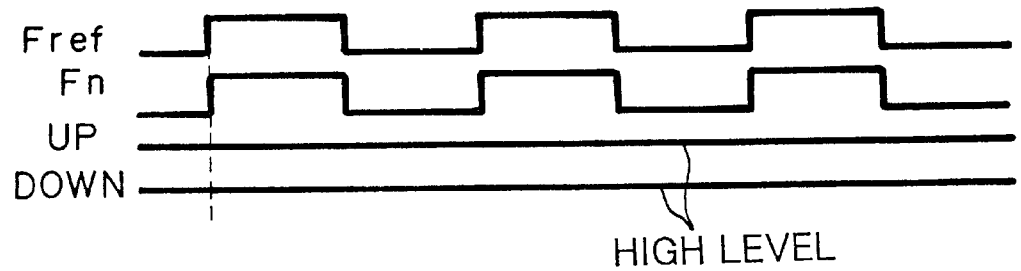
HIGH LEVEL
F I G. 12(d)
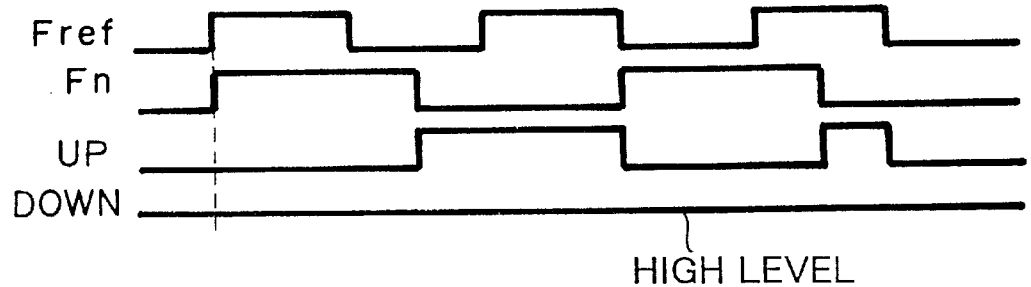
HIGH LEVEL

SEMICONDUCTOR APPARATUS FOR USE IN LOW VOLTAGE POWER SUPPLY

BACKGROUND OF THE INVENTION

1. Field of the Invention

The present invention relates to a semiconductor apparatus and, in particular, to a semiconductor apparatus for use in a low voltage power supply.

2. Description of the Related Art

As an example of a semiconductor integrated circuit whose circuit characteristics largely vary corresponding to the fluctuation of a voltage of power supply, a PLL (Phase Locked Loop) circuit is known. The PLL circuit that compensates the circuit operation against the fluctuation of the voltage of power supply has been disclosed, for example, in Japanese Patent Laid-Open Publication No. 4-167815.

Next, with reference to FIG. 14, the PLL circuit of the related art reference will be described. A phase comparator 1 that operates at a first power supply voltage 105 compares the phase of an input signal 101 with the phase of an output signal 104 of a voltage controlling oscillator 3 and outputs a first phase error signal 102. A constant voltage generator 4 inputs a second power supply voltage 107 and outputs a constant voltage 108 to a gate circuit 5.

The gate circuit 5 inputs the first phase error signal 102 and outputs a second phase error signal 106 to a low pass filter 2. The low pass filter 2 outputs an averaged control voltage signal 103 to the voltage controlling oscillator 3. The voltage controlling oscillator 3 inputs the control voltage signal 103 and outputs an output signal 104 to the phase comparator 1.

In this structure, when the first power supply voltage 105 that is input to the phase comparator 1 fluctuates, the first phase error signal 102 which is the output signal of the phase comparator 1 also fluctuates. However, when the voltage 108 that is output from the constant voltage generator 4 is constant, the voltage of the second phase error signal 106 that is output from the gate circuit 5 is kept constant.

Thus, since the second phase error signal 106 is averaged by the low pass filter 2, the voltage of the control signal 103 that is output from the low pass filter 2 does not fluctuate. In addition, the oscillation frequency of the voltage controlling oscillator 3 does not also fluctuate. As a result, a PLL circuit that is not affected by the fluctuation of the first power supply voltage 105 can be accomplished.

In the conventional PLL circuit, when the phase comparator 1 is composed of transistors, as the first power supply voltage 105 becomes lower, the operation speed of the transistors that compose the phase comparator 1 decreases. Thus, the phase error accuracy determined by the phase comparator 1 deteriorates. Even if the power supply voltage of the gate circuit 5 is supplied from the constant voltage generator 4 that is a constant power supply, when the frequency of the input signal 101 that is input to the phase comparator 1 exceeds a predetermined value, the phase comparator 1 does not follow the input signal 101. Thus, the PLL circuit malfunctions.

In addition, since the constant voltage generator 4 does not have a voltage raising function, when the second power supply voltage 107 that is input to the constant voltage generator 4 drops, the constant voltage generator 4 cannot output the gate circuit power supply voltage 108 required by the gate circuit 5. Thus, it is difficult to use the conventional PLL circuit with a low voltage power supply.

SUMMARY OF THE INVENTION

Therefore, an object of the present invention is to provide a semiconductor apparatus for use in a low voltage power supply without deterioration of the operation speed and accuracy.

Another object of the present invention is to provide a semiconductor apparatus for use in a low voltage power supply having a wide voltage range from a low voltage to a normal power supply voltage.

A further object of the present invention is to provide a semiconductor apparatus for use in a low voltage power supply without an influence of noise that takes place in raising the voltage.

The present invention is a semiconductor apparatus for use in a low voltage power supply which comprises an internal circuit that operates in synchronization with a first clock signal which is input from an external terminal or generated by a clock generating circuit; a voltage raising circuit for raising a power supply voltage in synchronization with a second clock signal whose pulse edge does not overlap with that of the first clock signal; and a constant voltage circuit for inputting an output voltage of the voltage raising circuit and supplying a constant voltage as a power supply voltage to the internal circuit.

These and other objects, features and advantages of the present invention will become more apparent in light of the following detailed description of modes of embodiment thereof, as illustrated in the accompanying drawings.

BRIEF DESCRIPTION OF DRAWINGS

FIG. 12 is a timing chart for explaining the operation of the PLL circuit 17;

DESCRIPTION OF PREFERRED EMBODIMENTS

Next, with reference to the accompanying drawings, a first embodiment of the present invention will be described.

Figure 1:
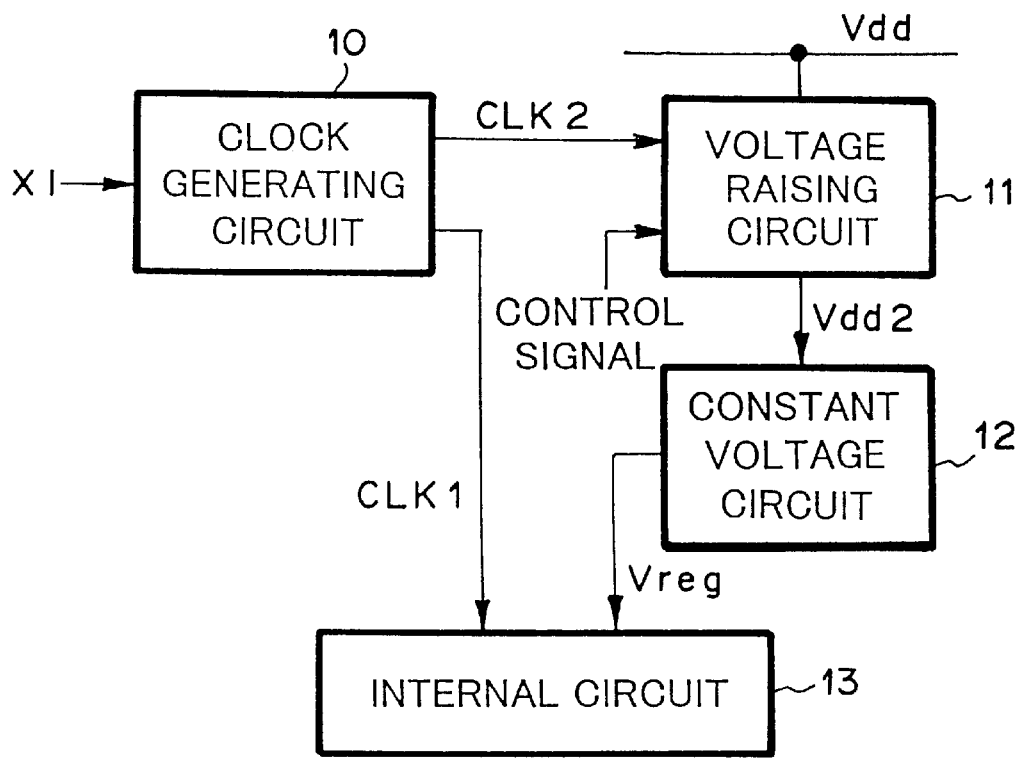
FIG. 1 is a block diagram showing the structure of a first embodiment of the present invention.

FIG. 1 is a block diagram for explaining a semiconductor apparatus for use in a low voltage power supply according to the first embodiment of the present invention. Referring to FIG. 1, the semiconductor apparatus comprises a clock generating circuit 10, a voltage raising circuit 11, a constant voltage circuit 12, and an internal circuit 13. The clock generating circuit 10 inputs a clock signal X1 and generates clock signals CLK1 and CLK2 whose leading edges do not overlap each other. The voltage raising circuit 11 raises a power supply voltage Vdd (Vdd2>Vdd) to a raised voltage Vdd2 in synchronization with the clock signal CLK2. The constant voltage circuit 12 generates a constant voltage Vreg with the raised voltage Vdd2. The internal circuit 13 that has a PLL circuit, a sample hold circuit, a comparator circuit, an A/D converter, a D/A converter, and so forth performs a calculating operation in synchronization with the clock signal CLK1. The internal circuit 13 is sensitive against noise and malfunctions therewith.

Alternatively, the clock signal CLK1 may be input to the internal circuit 13 from an external terminal instead of the clock generating circuit 10.

Figure 2:
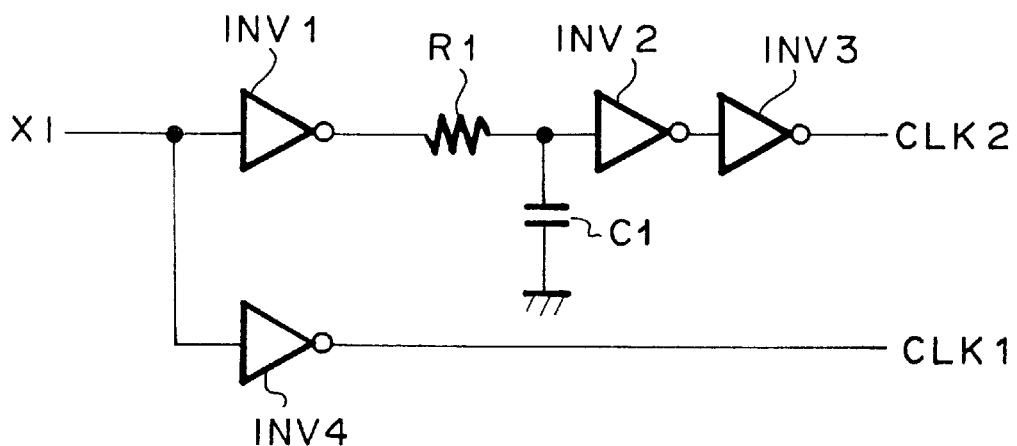
FIG. 2 is an equivalent circuit diagram of a clock generating circuit 10.

As shown in FIG. 2, the clock generating circuit 10 is composed of invertors INV1 to INV4, a resistor R1, and a capacitor C1.

Next, with reference to a timing chart shown in FIG. 3, the operation of the clock generating circuit 10 will be described. The inverter INV4 outputs a clock signal CLK1 of which the clock signal X1 is inverted. An output signal of the inverter INV1 is delayed corresponding to a time constant ($\tau$) defined by the resistance of the resistor R1 and the capacitance of the capacitor C1. Thereafter, the resultant signal is wave-shaped by the inverter INV2. The resultant signal is output from the inverter INV3 as the clock signal CLK2 shown in FIG. 3. Since the clock signal CLK2 delays against the clock signal CLK1 by the delay period $\tau$, the leading edge and the trailing edge of each pulse of the clock signal CLK1 do not overlap the leading edge and the trailing edge of each pulse of the clock signal CLK2.

Figure 4:
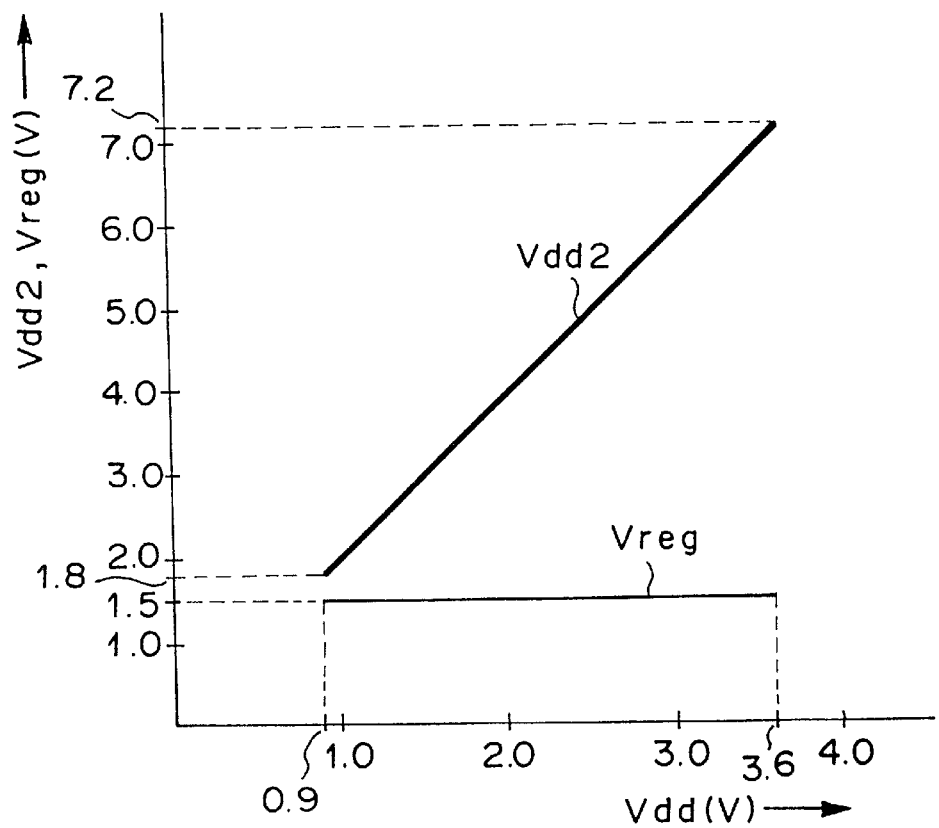
FIG. 4 is a graph for explaining the relation among a power supply voltage Vdd, the raised voltage Vdd2, and the constant voltage Vreg.

In addition, the voltage raising circuit 11 raises the power supply voltage Vdd corresponding to a characteristic (Vdd-Vdd2) as shown in FIG. 4 and outputs a raised voltage Vdd2. In the embodiment, the power supply voltage Vdd (0.9 to 3.6 V) is raised two times. The raised voltage Vdd2 (1.8 V to 7.2 V) is output.

Figure 5:
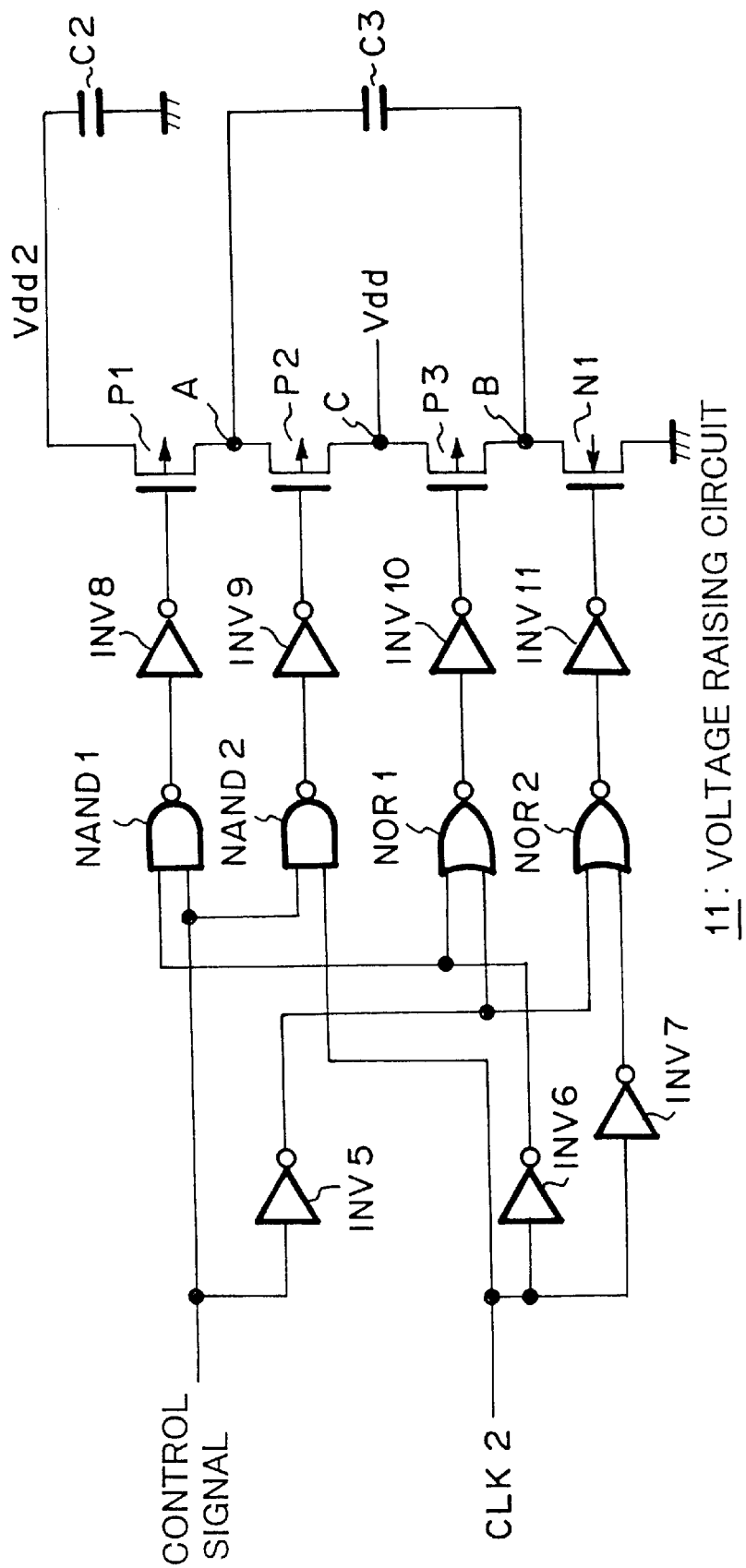
FIG. 5 is an equivalent circuit diagram of a voltage raising circuit 11.

Next, with reference to FIG. 5, the structure of the voltage raising circuit 11 will be described. The voltage raising circuit 11 is composed of P channel transistors P1 to P3, an N channel transistor N1, invertors INV5 to INV11, NAND circuits NAND1 and NAND2, NOR circuits NOR1 and NOR2, a capacitor C2, and a capacitor C3. The P channel transistors P1 to P3 and the N channel transistor N1 are connected in series. The capacitor C2 is connected between the source of the P channel transistor P1 and the ground. The capacitor C3 is connected between a common contact A of the drain of the P channel transistor P1 and the source of the P channel transistor P2 and a common contact B of the drain of the P channel transistor P3 and the drain of the N channel transistor N1.

Next, the operation of the voltage raising circuit 11 will be described.

When the signal level of the control signal is low, since the signal levels of the respective gates of the P channel transistors P1 and P2 are low, both the P channel transistors P1 and P2 are turned on. On the other hand, since the signal levels of the respective gates of the P channel transistor P3 and the N channel transistor N1 are high, the P channel transistor P3 is turned off and the N channel transistor N1 are turned on. Thus, first leads of the capacitors C2 and C3 are grounded. Second leads of the capacitors C2 and C3 are connected to a common contact C of the drain of the P channel transistor P2 and the source of the P channel transistor P3. Since the power supply voltage Vdd is applied to the common contact C, the power supply voltage Vdd is charged to both the capacitors C2 and C3. Consequently, a voltage raising operation is not performed.

When the signal level of the control signal becomes high, both the NAND circuits NAND1 and NAND2 and the NOR circuits NOR1 and NOR2 allow the clock signal CLK2 to pass. When the signal level of the clock signal CLK2 is high, the P channel transistors P1 and P3 are turned on, whereas the P channel transistor P2 and the N channel transistor N1 are turned off.

Thus, the capacitor C2 is connected to the common contact C through the P channel transistor P1, the capacitor C3, and the P channel transistor P3. The voltage of the common contact B is raised from the ground voltage to the power supply voltage Vdd. Consequently, the voltage of the common contact A is raised around two times as large as the power supply voltage Vdd. In this way, the raised voltage Vdd2 is raised around two times as large as the power supply voltage Vdd.

Figure 3:
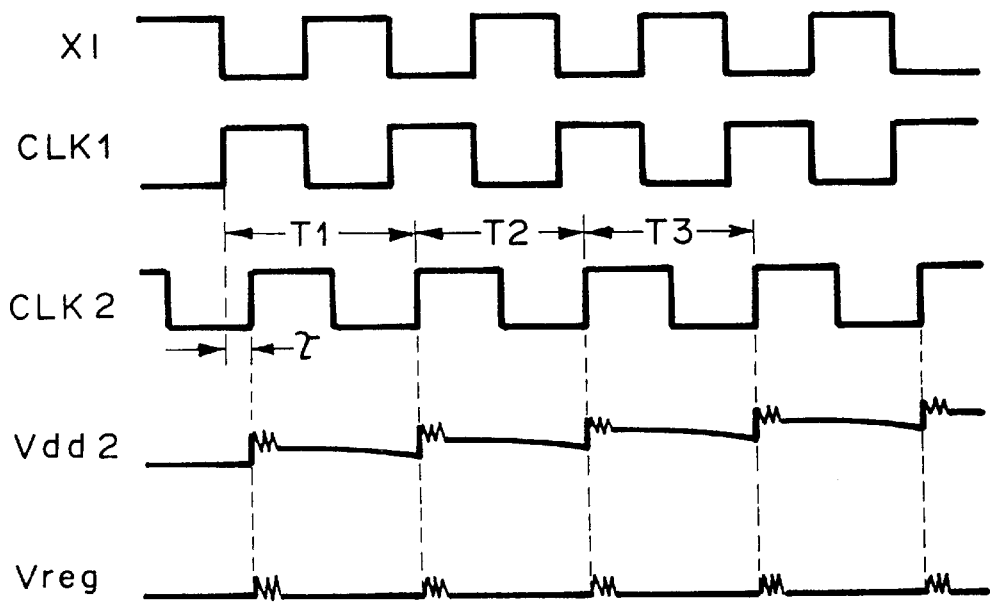
FIG. 3 is a wave form chart for explaining a timing of the clock generating circuit 10 and noise superimposed to a raised voltage Vdd2 and a constant voltage Vreg.

At this point, as shown in the signal waveform of Vdd2 of FIG. 3, instantaneous noise that takes place at a leading edge of the clock signal CLK2 is superimposed to the raised voltage Vdd2.

When the signal level of the clock signal CLK2 is low, the P channel transistors P2 and N channel transistor N1 are turned on, whereas the P channel transistors P1 and P3 are turned off. Thus, the capacitor C2 keeps a voltage two times as large as the power supply voltage. On the other hand, the power supply voltage Vdd is charged to the capacitor C3 from the common contact C through the P channel transistor P2.

As shown in FIG. 3, the raised voltage Vdd2 is successively raised in periods T1, T2, and T3. Finally, the raised voltage Vdd2 is raised just two times as large as the power supply voltage Vdd as shown in FIG. 4.

In the above example, the doubler circuit that raises the power supply voltage Vdd by two times was described. However, the present invention can be also applied to another circuit as long as it raises a voltage with the similar circuit operation.

As shown in FIG. 4, the constant voltage circuit 12 inputs the raised voltage Vdd2 and outputs the constant voltage Vreg (for example, 1.5 V) to the internal circuit 13. As described above, the semiconductor apparatus for use in the low voltage power supply according to the present invention can supply the constant voltage Vreg to the internal circuit 13 in a wide range of the power supply voltage Vdd. Thus, a semiconductor apparatus for use in a low voltage power supply that operates in a wide range of power supply voltages from a low voltage (0.9 V) to a normal power supply voltage (3.6 V) can be accomplished.

In addition, as shown in FIG. 3, noise may be superimposed to the constant voltage Vreg in synchronization with a leading edge of the clock signal CLK2. In other words, the constant voltage circuit 12 cannot completely remove noise that has superimposed to the raised voltage Vdd2 generated by the voltage raising circuit 11. Thus, part of the noise may be added to the constant voltage Vreg.

The internal circuit 13 comprises a PLL circuit, a sample hold circuit, a comparator circuit, an A/D converter, and a D/A converter that are sensitive to noise and malfunction therewith. However, as shown in FIG. 3, a leading edge (or a trailing edge) of each pulse of the clock signal CLK2 that generates noise is shifted in time from a leading edge (or a trailing edge) of each pulse of the clock signal CLK1 that is a timing at which the internal circuit 13 performs a calculating process. Thus, the noise of the constant voltage Vreg does not affect the calculating process of the internal circuit 13.

Consequently, a semiconductor apparatus for use in a low voltage power supply that is not affected by noise that takes place in a voltage raising operation of the power supply voltage Vdd (with high accuracy) can be accomplished.

Figure 6:
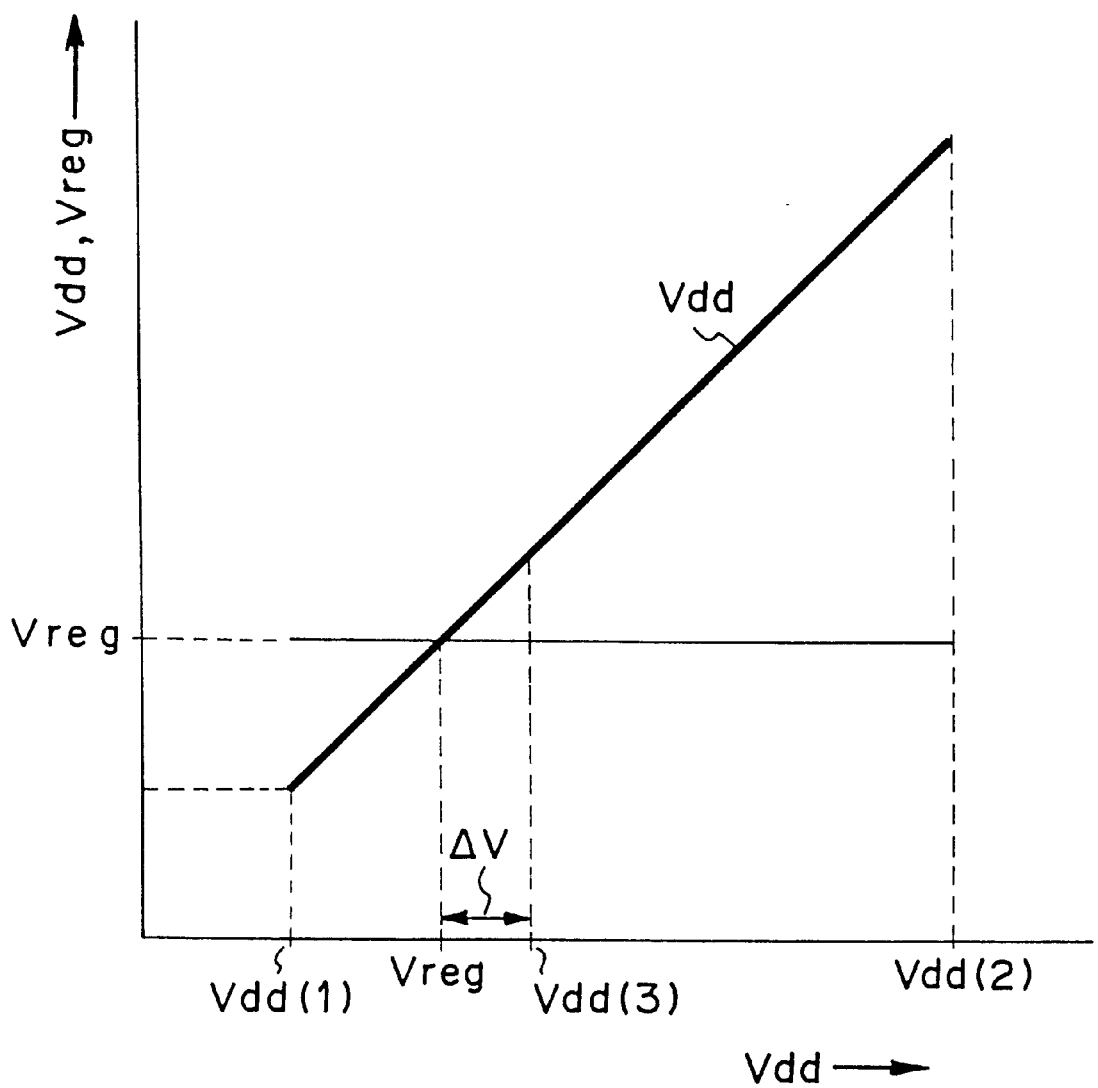
FIG. 6 is a graph for explaining a method for determining a voltage Vdd(3) corresponding to the constant voltage Vreg.

Next, with reference to FIGS. 1 and 6, a second embodiment of the present invention will be described.

The structure of the second embodiment of the present invention is the same as the structure of the first embodiment shown in FIG. 1. In FIG. 6, the range of the power supply voltage Vdd that Is supplied to the voltage raising circuit 11 is Vdd(1) to Vdd(2). Assuming that the constant voltage that is output by the constant voltage circuit 12 is Vreg, when the power supply voltage Vdd becomes a voltage Vdd(3) (=Vreg+$\Delta$V) where $\Delta$V is a margin, the signal level of the control signal is varied from the high level to the low level so as to cause the voltage raising circuit 11 to stop the voltage raising operation. Thus, the voltage raising circuit 11 outputs the power supply voltage Vdd. In this example, the margin $\Delta$V is 1.0 V.

The constant voltage circuit 12 receives the voltage Vdd(3)(=Vreg+$\Delta$V) from the voltage raising circuit 11 and outputs the constant voltage Vreg. When the margin $\Delta$V is around 1.0 V, the constant voltage circuit 12 stably operates.

In this embodiment, when the power supply voltage Vdd becomes high, the voltage raising operation is not unnecessarily performed. Thus, the circuit current can be decreased.

Figure 7:
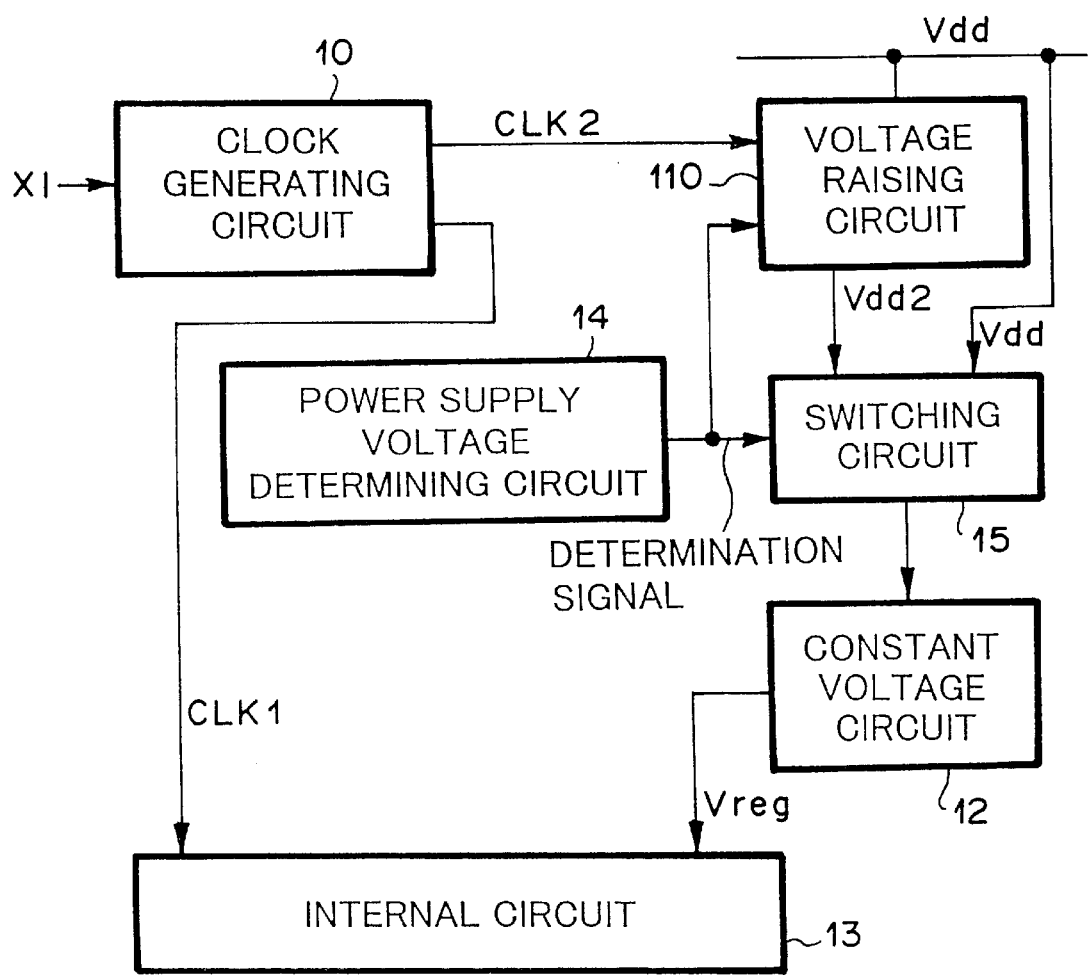
FIG. 7 is a block diagram showing the structure of a third embodiment of the present invention.

Next, with reference to a block diagram shown in FIG. 7, a third embodiment of the present invention will be described.

A semiconductor apparatus for use in a low voltage power supply according to the third embodiment comprises a clock generating circuit 10, a constant voltage circuit 12, an internal circuit 13, a power supply voltage determining circuit 14, a voltage raising circuit 110, and a switching circuit 15. The operations of clock generating circuit 10, the constant voltage circuit 12, and the internal circuit 13 of the third embodiment are the same as those of the first embodiment shown in FIG. 1. The power supply voltage determining circuit 14 outputs a determination signal in such a manner that when the power supply voltage Vdd is lower than a constant voltage Vs, the signal level of the determination signal is high and that when the power supply voltage Vdd is equal to or higher than the constant voltage Vs, the signal level of the determination signal is low. The operation of the voltage raising circuit 110 is similar to the operation of the voltage raising circuit 11 shown in FIG. 1 except that the voltage raising circuit 110 shuts off a circuit current corresponding to the determination signal received from the power supply voltage determining circuit 14. The switching circuit 15 selects one of the raised voltage Vdd2 of the voltage raising circuit 110 and the power supply voltage Vdd corresponding to the determination signal and outputs the selected voltage to the constant voltage circuit 12.

When the power supply voltage Vdd is lower than the constant voltage Vs, since the signal level of the determination signal received from the power supply voltage determining circuit 14 is high, the voltage raising circuit 110 performs a voltage raising operation similar to that of the voltage raising circuit 11 and outputs the raised voltage Vdd2 to the switching circuit 15. Since the signal level of the determination signal is high, the switching circuit 15 selects the raised voltage Vdd2 and outputs it to the constant voltage circuit 12.

In contrast, when the power supply voltage Vdd is equal to or higher than the constant voltage Vs, the signal level of the determination signal received from the power supply voltage determining circuit 14 becomes low. Thus, corresponding to the low level of the determination signal, the voltage raising circuit 110 shuts off the circuit current and stops the voltage raising operation. Since the signal level of the determination signal is low, the switching circuit 15 selects the power supply voltage Vdd and outputs it to the constant voltage circuit 12.

Similarly to the second embodiment, assuming that Vs=Vreg+$\Delta$V and that a margin $\Delta$V is around 1.0 V, the constant voltage circuit 12 stably operates and outputs a constant voltage Vreg.

In the third embodiment of the present invention, when the power supply voltage Vdd becomes high, since the circuit current of the voltage raising circuit 110 is shut off, the circuit current can be more decreased than that of the second embodiment.

Next, with reference to FIG. 8, a forth embodiment of the present invention will be described.

Figure 8:
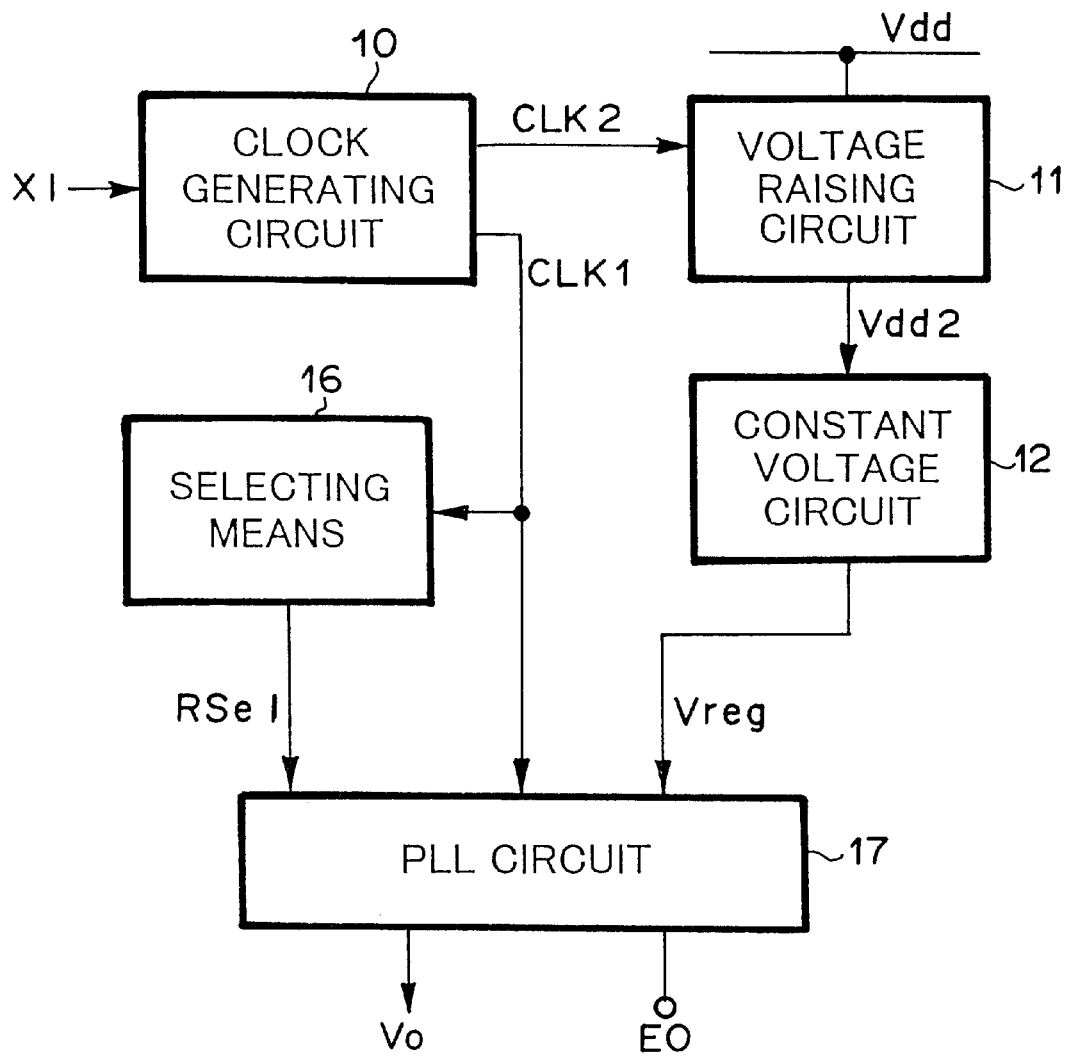
FIG. 8 is a block diagram showing the structure of a fourth embodiment of the present invention.

FIG. 8 is a block diagram for explaining a semiconductor apparatus for use in a low voltage power supply according to the fourth embodiment of the present invention. The apparatus according to the fourth embodiment comprises a clock generating circuit 10, a voltage raising circuit 11, a constant voltage circuit 12, a selecting means 16, and a PLL circuit 17. The operations of the clock generating circuit 10, the voltage raising circuit 11, and the constant voltage circuit 12 of the apparatus according to the forth embodiment are the same as those of the apparatus according to the first embodiment shown in FIG. 1. The selecting means 16 outputs a reference selector signal RSel corresponding to the clock signal CLK1.

Figure 9:
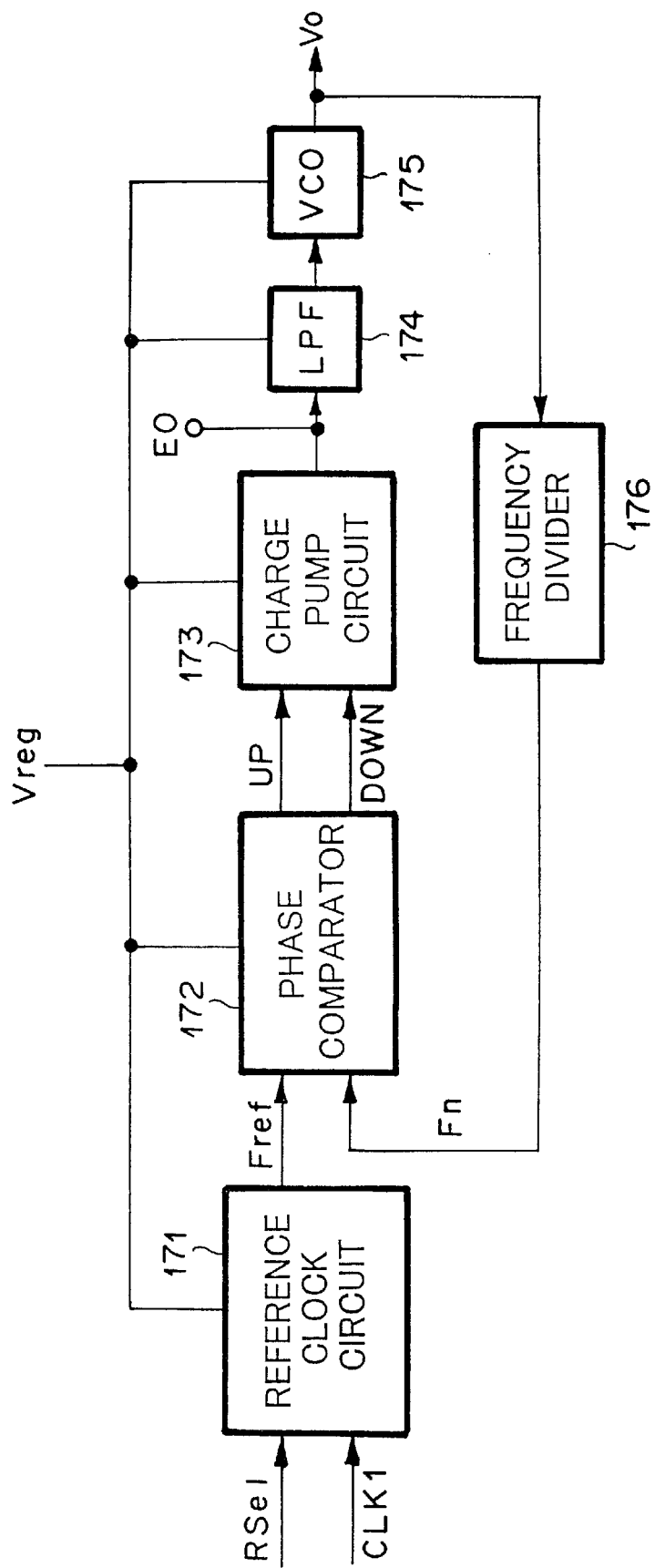
FIG. 9 is a block diagram showing the structure of a PLL circuit 17.

As shown in FIG. 9, the PLL circuit 17 comprises a reference clock circuit 171, a phase comparator 172, a charge pump circuit 173, an LPF (Low Pass Filter) 174, a VCO (Voltage Controlled Oscillator) 175, and a frequency dividing circuit 176. The reference clock circuit 171 divides the clock signal CLK1 by n (where n=2, 3, ... ) and selects a reference clock signal Fref from the frequency divided signals corresponding to a reference selector signal RSel. The phase comparator 172 compares the phase difference between the trailing edge of a pulse of the reference clock signal Fref and the trailing edge of a pulse of the frequency divided signal Fn. When the phase of the frequency divided signal Fn advances against the phase of the reference clock signal Fref, the phase comparator 172 outputs a down signal Down. When the phase of the frequency divided signal Fn are delayed against the phase of the reference clock signal Fref, the phase comparator 172 outputs an up signal Up. When the phase of the frequency divided signal Fn matches the phase of the reference clock signal Fref, the phase comparator 172 outputs a signal in a high level. When the charge pump circuit 173 inputs the down signal Down from the phase comparator 172, the charge pump circuit 173 receives a current from an output terminal. When the charge pump circuit 173 inputs the up signal Up from the phase comparator 172, the charge pump circuit 173 supplies a current to the output terminal. When the charge pump circuit 173 inputs the signal in the high level from the phase comparator 172, the output of the charge pump circuit 173 becomes a high impedance state. The LPF 174 has a capacitor that charges and discharges the output current of the charge pump circuit 173 so as to smoothen the output current. The VCO 175 controls an oscillation frequency corresponding to the output signal of the LPF 174. The frequency divider 176 divides the oscillation frequency Fo of the oscillation output Vo of the VCO 175 by N (where N=1, 2, . . . ) and outputs the frequency divided signal Fn. A constant voltage Vreg is supplied as a power supply voltage to each circuit block of the apparatus.

Next, with reference to FIGS. 10 and 11, the operation of the reference clock circuit 171 will be described.

Figure 10:
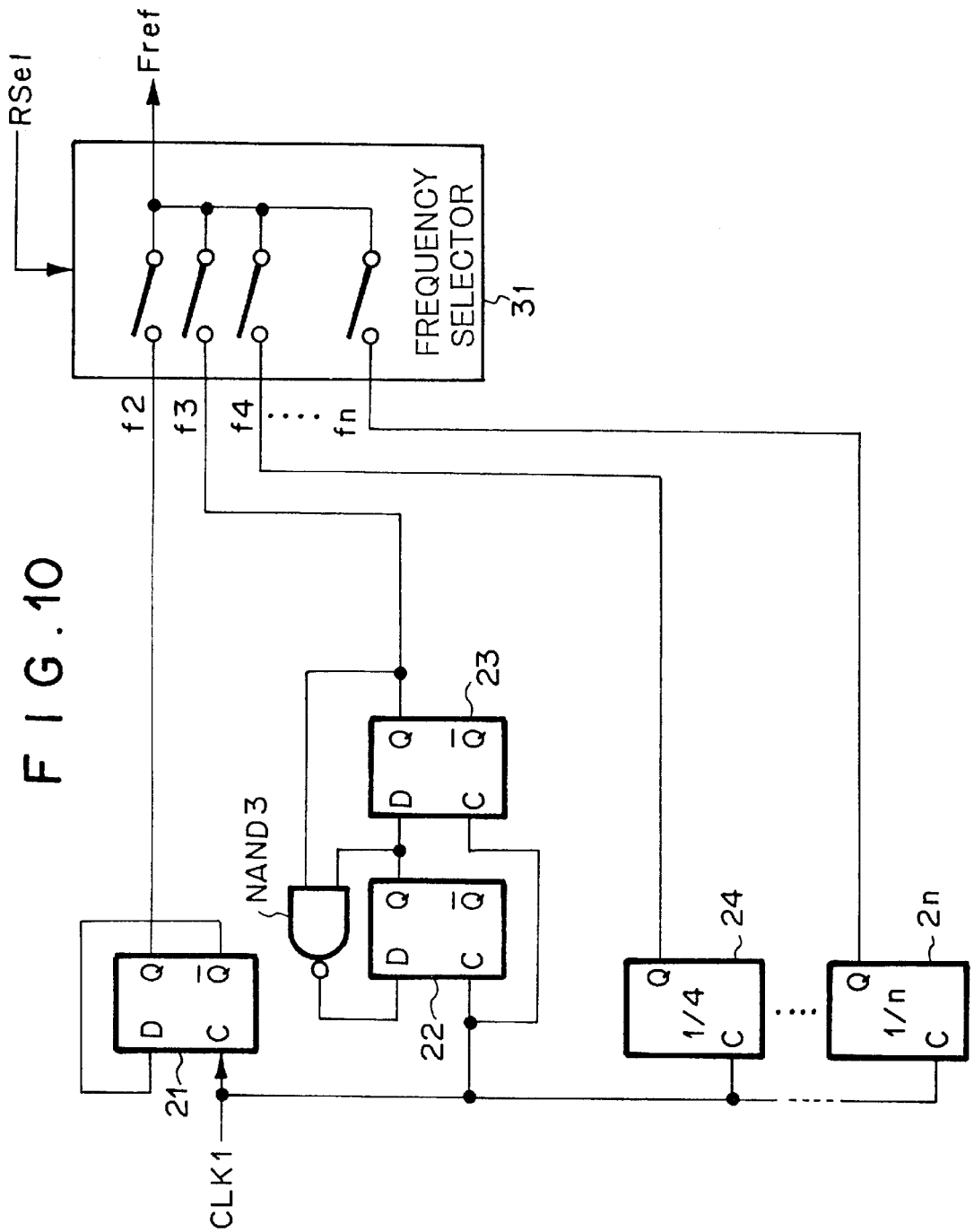
FIG. 10 is a block diagram showing the structure of a reference clock circuit 171.

As shown in FIG. 10, the reference clock circuit 171 comprises flip-flops 21 to 23, a NAND circuit NAND 3, ¼ frequency divider 24 to 1/n frequency dividers 2n where n=5, 6, 7, . . . , and a frequency selector 31.

Figure 11:
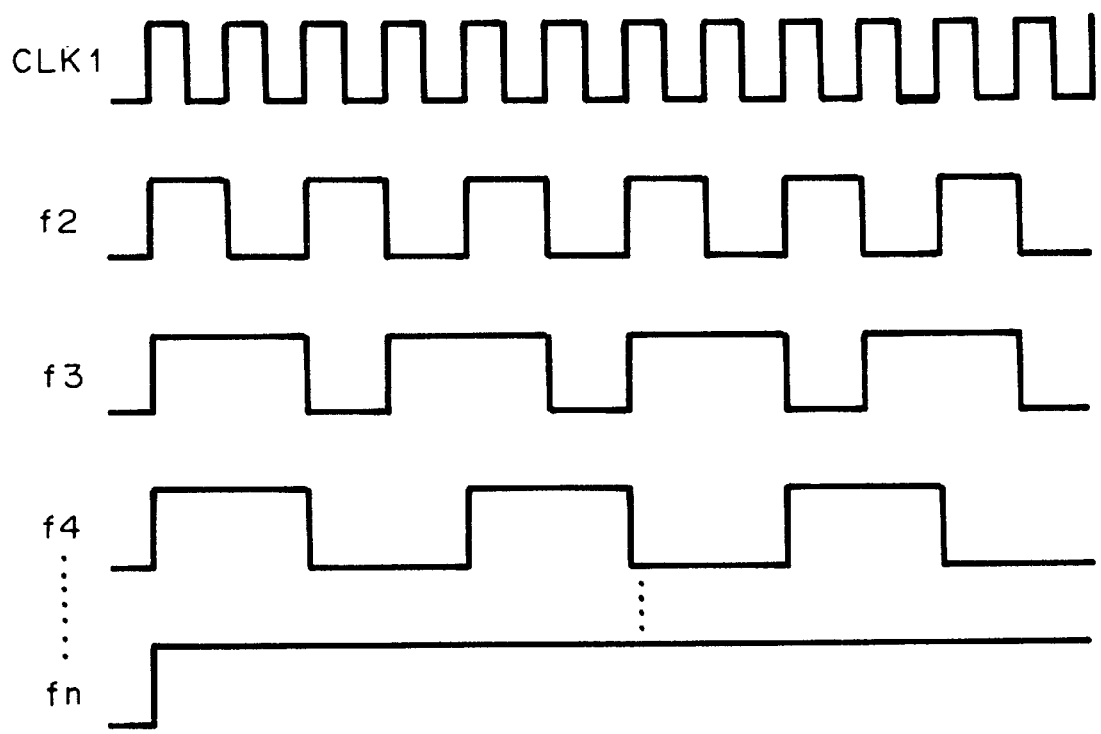
FIG. 11 is a timing chart for explaining the operation of the reference clock circuit 171.

The flip-flop 21 outputs a frequency divided clock signal f2 of which the clock signal CLK1 is divided by 2 as shown in FIG. 11 to one input terminal of the frequency selector 31. The ⅓ frequency divider is composed of the flip-flops 22 and 23 and the NAND circuit 3. The ⅓ frequency divider outputs a frequency divided clock signal f3 of which the clock signal CLK1 is divided by 3 as shown in FIG. 11 to another input terminal of the frequency selector 31.

Likewise, the ¼ frequency divider 24 to 1/n frequency divider 2n output frequency divided clock signals f4 to fn of which the click signal CLK1 is divided by 4 to n as shown in FIG. 11 to relevant input terminals of the frequency selector 31. The frequency selector 31 selects one of the frequency divided clock signals f2 to fn corresponding to the reference selector signal RSel and outputs the selected signal as a reference clock signal Fref to the phase comparator 172.

Next, with reference to FIGS. 9 and 12, the operation of the PLL circuit will be described.

FIG. 12(*a*) shows the case that the phase of the divided frequency signal Fn is delayed against the phase of the reference clock signal Fref. In this case, the phase comparator 172 detects the phase difference between these signals and outputs the phase difference as an up signal UP to the charge pump circuit 173.

When the charge pump circuit 173 inputs the up signal UP, it supplies a current to a capacitor (not shown) of the LPF 174. Thus, since the capacitor of the LPF 174 is charged by the charge pump circuit 173, the voltage that is output to the VCO 175 becomes high. Consequently, since the oscillation frequency Fo of the VCO 175 and the frequency of the frequency divided signal Fn as an output signal of the frequency divider 176 become high, a feedback operation is performed so that the phase of the reference clock signal Fref matches the phase of the frequency divided signal Fn.

In contrast, as shown in FIG. 12(*b*), when the phase of the frequency divided signal precedes against the phase of the reference clock signal Fref, the phase comparator 172 outputs a down signal Down equivalent to the phase difference to the charge pump circuit 173.

When the charge pump circuit 173 inputs the down signal Down, it receives a current from the capacitor (not shown) of the LPF 174. Thus, since the capacitor of the LPF 174 is discharged by the charge pump circuit 173, the voltage that is output to the VCO 175 becomes low. Thus, since the oscillation frequency Fo of the VCO 175 and the frequency of the frequency divided signal Fn as the output signal of the frequency divider 176 become low, a feedback operation is performed so that the phase of the reference clock signal Fref matches the phase of the frequency divided signal Fn.

When the phase of the frequency divided signal Fn matches the phase of the reference clock frequency Fref as shown in FIG. 12(*c*), the phase comparator 172 output a signal in a high level to the charge pump circuit 173.

When the charge pump circuit 173 inputs the signal in the high level, since the output terminal of the charge pump circuit 173 becomes high impedance state, the charge pump circuit 173 does not drive the current. Thus, since the output voltage of the LPF 174 becomes constant, the oscillation frequency Fo of the VCO 175 and the frequency of the frequency divided signal Fn as the output signal of the frequency divider 176 become constant.

When the frequency of the frequency divided signal Fn is lower than the frequency of the reference clock signal Fref as shown in FIG. 12(*d*), similarly to the case shown in FIG. 12(*a*), the phase comparator 172 outputs the up signal UP to the charge pump circuit 173. Thus, the PLL loop operates so that the frequency of the frequency divided signal Fn matches the frequency of the reference clock signal Fref.

As described above, only when the phase of the reference clock signal Fref matches the phase of the frequency divided signal Fn in the PLL circuit 17 (namely, the PLL circuit is locked), the output terminal EO of the charge pump circuit 173 becomes high impedance state.

Next, the principal operation of the semiconductor apparatus for use in the low voltage power supply according to the fourth embodiment of the present invention will be described.

The selecting means 16 inputs the clock signal CLK1 and outputs the reference selector signal RSel to the frequency selector 31 of the reference clock circuit 171 that composes the PLL circuit 17.

The reference clock circuit 171 that composes the PLL circuit 17 selects, corresponding to the reference selector signal RSel, one of the frequency divided clock signals f2 to fn of which the frequency of the clock signal is divided and outputs the selected frequency divided clock signal as the reference clock signal Fref to the phase comparator 172. Assuming that the frequency dividing ratio of the frequency divider 176 is m and the frequency dividing ratio selected by the reference clock circuit 171 is n, the oscillation frequency Fo of the oscillation output Vo of the VCO 175 is expressed as follows.

$$Fo=(m/n)\cdot(\text{frequency of clock signal } CLK1)$$

When m and n are properly selected, any pulse signal that synchronizes with the clock signal CLK1 can be obtained.

When the present invention is applied to a DTS (Digital Tuning System) that selects one from signals received from many broadcast stations, by supplying an output signal Vo of the PLL circuit 17 to a demodulating circuit (not shown), a signal (program) can be automatically selected.

In addition, when the output terminal Eo of the PLL circuit 17 is in high impedance state, since the PLL circuit 17 is in lock state, it can be easily determined whether the DTS is selecting or has selected a program.

Figure 13:
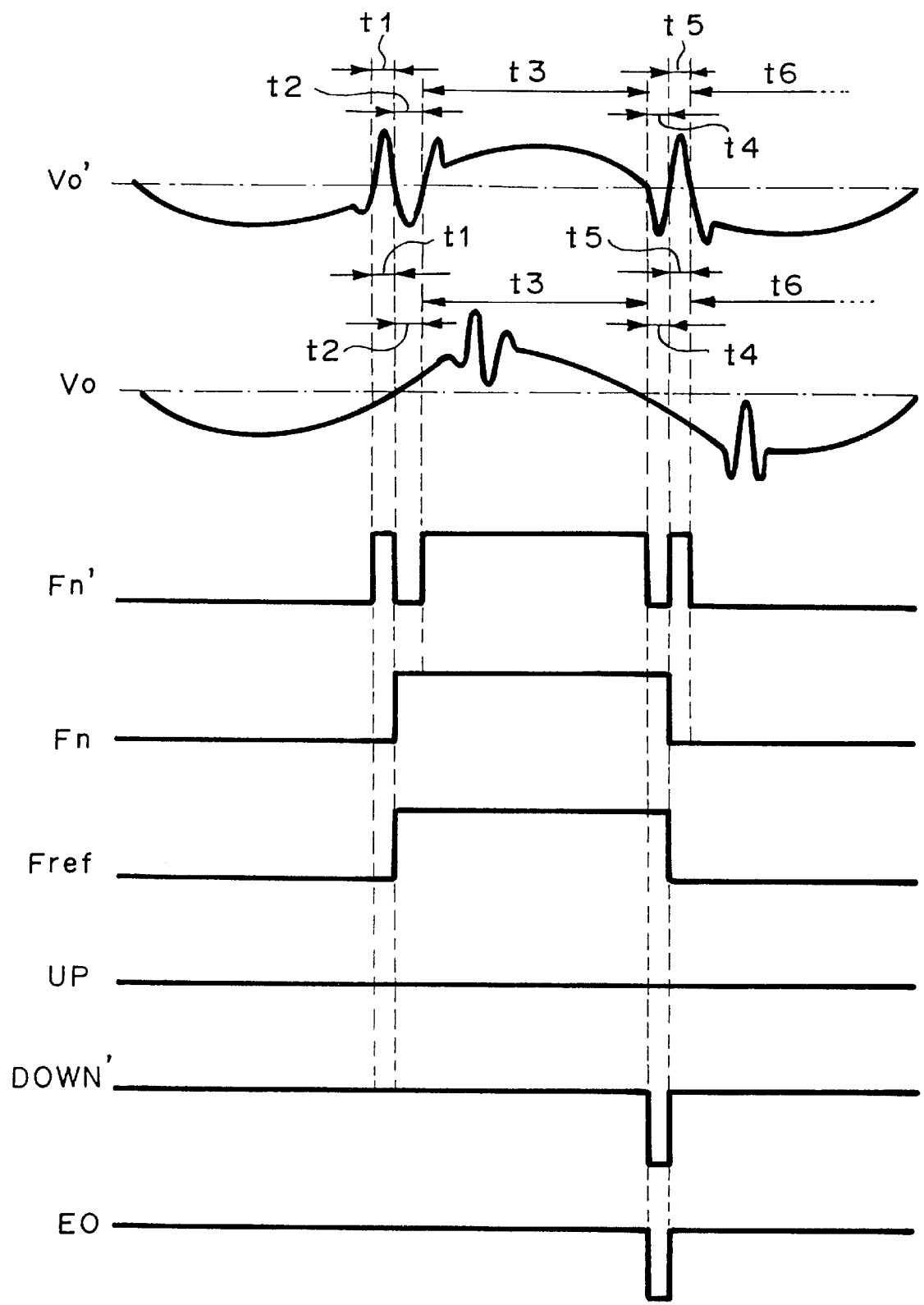
FIG. 13 is a wave form chart for explaining the operation of the PLL circuit 17 in the case that noise is superimposed to an output signal Vo of a VCO 175.
Figure 14:
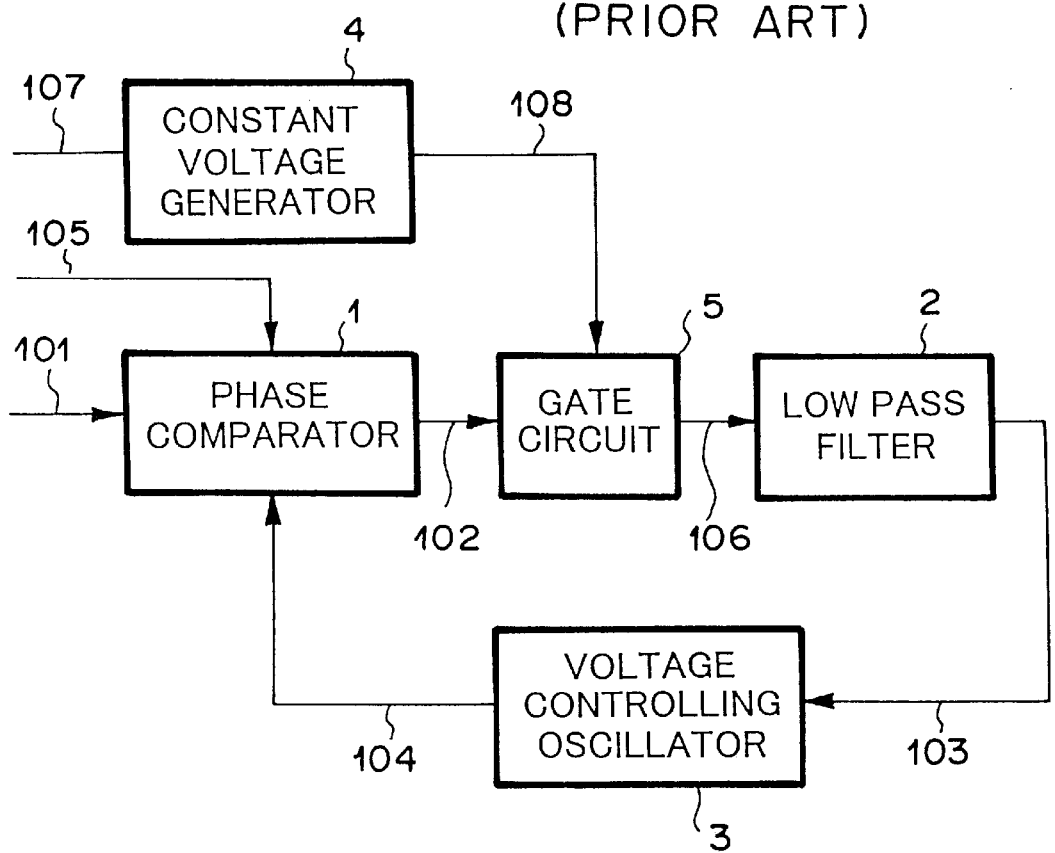
FIG. 14 is a block diagram showing the structure of a conventional PLL circuit.

Next, with reference to FIG. 13, an influence of noise generated in the voltage raising circuit 11 on the PLL circuit 17 will be described. In FIG. 13, Vo' represents a signal waveform in the case that the clock signal of the voltage raising circuit 11 is CLK1 and that the noise generated by the voltage raising circuit 11 is superimposed to the oscillation output Vo of the VCO 175.

While the frequency divider 176 is wave-shaping the signal Vo', the frequency divided signal Fn' inverts due to noise at period t1 in positive direction, at period t2 in negative direction, at period t4 in negative direction, and at period t5 in positive direction, respectively.

The phase comparator 172 compares the phase of the frequency divided signal Fn' and the phase of the reference clock signal Fref and outputs the down signal Down' corresponding to the noise generated at period t4. Thus, an improper signal as shown in FIG. 13 is output to the output terminal EO of the charge pump circuit 173.

On the other hand, in this embodiment, as the clock signal of the voltage raising circuit 11, CLK2 that is delayed by a delay period τ against the clock signal CLK1 is used. Thus, the output signal Vo of the VCO 175 is superimposed with noise at periods t3 and t6 similarly to Vo shown in FIG. 13.

The frequency divider 176 wave-shapes the signal Vo to a normal wave shape as denoted by Fn of FIG. 13. Even if an inverted pulse signal is generated by noise, a pulse signal due to the noise is generated sufficiently apart from a trailing edge of the reference clock signal Fref.

In other words, by designating an interval from a trailing edge of the reference clock signal Fref to the occurrence position of the noise pulse signal with a time constant defined by the resistor R1 and the capacitor C1 of the clock generating circuit 10, the phase comparator 172 can be prevented from being adversely affected by the noise pulse.

Thus, although the phase comparator 172 compares the phase of the reference clock signal Fref and the phase of the frequency divided signal Fn, the phase comparator 172 is not affected by the noise generated in the voltage raising circuit 11. Thus, since the noise resistance of the PLL circuit is remarkably improved, it can stably operate.

Since the semiconductor apparatus for use in the low voltage power supply according to the embodiment has the voltage raising circuit 11 and the constant voltage circuit 12, the apparatus can operate in a wide range of power supplies from a low voltage power supply of around 0.9 V to a normal voltage power supply of around 3.6 V.

In addition, unlike with the conventional PLL circuit, the response speed does not decrease corresponding to the decrease of the power supply voltage. Thus, a high speed PLL circuit can be accomplished.

The selecting means 16 shown in FIG. 8 may be composed of a CPU (Central Processing Unit) (not shown). In other words, since the DTS has a CPU that controls many circuit blocks thereof, it is convenient to cause the CPU to output the reference selector signal RSel.

In the PLL circuit shown in FIG. 9, the LPF 174 and the VCO 175 may be disposed as an external circuit of a semiconductor chip that has the clock generating circuit 10, the voltage raising circuit 11, the constant voltage circuit 12, the reference clock circuit 171, the phase comparator 172, the charge pump circuit 173, and so forth.

In this case, a power supply for the LPF 174 and VCO 175 is different from a power supply that gives the power supply voltage Vdd and the raised voltage Vdd2. Thus, the noise generated by the voltage raising circuit 11 does not affect the operations of the LPF 174 and the VCO 175.

It should be noted that the present invention can be applied to a structure with three or more phases of a clock signal.

As described above, since the semiconductor apparatus for use in the low voltage power supply according to the present invention has the voltage raising circuit and the constant voltage circuit, the apparatus can operate with various power supplies in a wide range from a low voltage power supply to a normal voltage power supply. Thus, the apparatus can stably operate without decrease of the operation speed and circuit accuracy.

In addition, noise that is generated at a trailing edge of one clock signal in the voltage raising circuit does not affect a noise-sensitive circuit that operates in synchronization with the other clock signal by using two clock signals with different phases. Thus, the apparatus stably operates in disregard of noise generated in the voltage raising circuit.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor apparatus for use in a low voltage power supply, comprising:

an internal circuit which operates in synchronization with a first clock signal which is input from an external terminal or generated by a clock generating circuit;

a voltage raising circuit for raising a power supply voltage in synchronization with a second clock signal whose pulse edge is in delayed synchronization with the first clock signal and does not overlap with that of the first clock signal; and a constant voltage circuit for inputting an output voltage of said voltage raising circuit and supplying a constant voltage as a power supply voltage to said internal circuit.

2. The semiconductor apparatus as set forth in claim 1, wherein the interval of leading edges or trailing edges of the first and second clock signals is larger than the interval of noise generated in synchronization with the second clock signal by said voltage raising circuit.

3. A semiconductor apparatus for use in a low voltage power supply, comprising:

an internal circuit which operates in synchronization with a first clock signal which is input from an external terminal or generated by a clock generating circuit;

a voltage raising circuit for raising a power supply voltage in synchronization with a second clock signal whose pulse edge does not overlap with that of the first clock signal; and a constant voltage circuit for inputting an output voltage of said voltage raising circuit and supplying a constant voltage as a power supply voltage to said internal circuit, wherein said voltage raising circuit raises the power supply voltage when the power supply voltage is lower than a predetermined value, and wherein said voltage raising circuit stops raising the power supply voltage and outputting it when the power supply voltage is equal to or higher than the predetermined value.

4. The semiconductor apparatus as set forth in claim 2, wherein said voltage raising circuit raises the power supply voltage when the power supply voltage is lower than a predetermined value, and wherein said voltage raising circuit stops raising the power supply voltage and outputting it when the power supply voltage is equal to or higher than the predetermined value.

5. The semiconductor apparatus as set forth in claim 3, wherein the predetermined value is designated by adding a positive margin voltage to the constant voltage which is output from said constant voltage circuit.

6. The semiconductor apparatus as set forth in claim 4, wherein the predetermined value is designated by adding a positive margin voltage to the constant voltage which is output from said constant voltage circuit.

7. A semiconductor apparatus for use with a low voltage power supply, comprising:

an internal circuit which operates in synchronization with a first clock signal which is input from an external terminal or generated by a clock generating circuit;

a power supply voltage determining circuit for outputting a determination signal which represents whether or not a power supply voltage is higher than a threshold value;

a voltage raising circuit for raising the power supply voltage in synchronization with a second clock signal whose pulse edge does not overlap with that of the first clock signal and shutting off an internal circuit current when the power supply voltage becomes equal to or higher than the threshold value as the determined result corresponding to the determination signal;

a switching circuit for outputting the raised voltage of said voltage raising circuit when the power supply voltage is lower than the threshold value as the determined result corresponding to the determination signal and for outputting the power supply voltage when the power supply voltage is equal to or higher than the threshold value as the determined result corresponding to the determined result; and a constant voltage circuit for inputting an output voltage of said switching circuit and supplying a constant voltage as a power supply voltage to said internal circuit.

8. The semiconductor apparatus as set forth in one of claim 1, wherein said internal circuit is a PLL circuit and the PLL circuit comprises:

a phase comparator for detecting the phase difference between a reference clock signal and a frequency divided signal of a frequency divider and outputting an error signal equivalent to the phase difference;

a charge pump circuit for inputting the error signal and outputting a three-state signal;

a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;

a voltage control oscillator for varying the oscillation frequency corresponding to the output signal of said low pass filter; and a frequency divider for dividing the frequency of the output signal of said voltage controlling oscillator.

9. The semiconductor apparatus as set forth in one of claim 2, wherein said internal circuit is a PLL circuit and the PLL circuit comprises:

a phase comparator for detecting the phase difference between a reference clock signal and a frequency divided signal of a frequency divider and outputting an error signal equivalent to the phase difference;

a charge pump circuit for inputting the error signal and outputting a three-state signal;

a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;

a voltage control oscillator for varying the oscillation frequency corresponding to the output signal of said low pass filter; and a frequency divider for dividing the frequency of the output signal of said voltage controlling oscillator.

10. The semiconductor apparatus as set forth in one of claim 3, wherein said internal circuit is a PLL circuit and the PLL circuit comprises:

a phase comparator for detecting the phase difference between a reference clock signal and a frequency divided signal of a frequency divider and outputting an error signal equivalent to the phase difference;

a charge pump circuit for inputting the error signal and outputting a three-state signal;

a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;

a voltage control oscillator for varying the oscillation frequency corresponding to the output signal of said low pass filter; and a frequency divider for dividing the frequency of the output signal of said voltage controlling oscillator.

11. The semiconductor apparatus as set forth in one of claim 4, wherein said internal circuit is a PLL circuit and the PLL circuit comprises:

a phase comparator for detecting the phase difference between a reference clock signal and a frequency divided signal of a frequency divider and outputting an error signal equivalent to the phase difference;

a charge pump circuit for inputting the error signal and outputting a three-state signal;

a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;

a voltage control oscillator for varying the oscillation frequency corresponding to the output signal of said low pass filter; and a frequency divider for dividing the frequency of the output signal of said voltage controlling oscillator.

12. The semiconductor apparatus as set forth in one of claim 5, wherein said internal circuit is a PLL circuit and the PLL circuit comprises:

a phase comparator for detecting the phase difference between a reference clock signal and a frequency divided signal of a frequency divider and outputting an error signal equivalent to the phase difference;

a charge pump circuit for inputting the error signal and outputting a three-state signal;

a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;

a voltage control oscillator for varying the oscillation frequency corresponding to the output signal of said low pass filter; and a frequency divider for dividing the frequency of the output signal of said voltage controlling oscillator.

13. The semiconductor apparatus as set forth in one of claim 6,
wherein said internal circuit is a PLL circuit and the PLL circuit comprises:
a phase comparator for detecting the phase difference between a reference clock signal and a frequency divided signal of a frequency divider and outputting an error signal equivalent to the phase difference;
a charge pump circuit for inputting the error signal and outputting a three-state signal;
a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;
a voltage control oscillator for varying the oscillation frequency corresponding to the output signal of said low pass filter; and
a frequency divider for dividing the frequency of the output signal of said voltage controlling oscillator.

14. The semiconductor apparatus as set forth in one of claim 7,
wherein said internal circuit is a PLL circuit and the PLL circuit comprises:
a phase comparator for detecting the phase difference between a reference clock signal and a frequency divided signal of a frequency divider and outputting an error signal equivalent to the phase difference;
a charge pump circuit for inputting the error signal and outputting a three-state signal;
a low pass filter for inputting the three-state signal, for raising an output voltage when the phase of the frequency divided signal is delayed against the phase of the reference clock signal, and for lowering the output voltage when the phase of the frequency divided signal precedes the phase of the reference clock signal;
a voltage control oscillator for varying the oscillation frequency corresponding to the output signal of said low pass filter; and
a frequency divider for dividing the frequency of the output signal of said voltage controlling oscillator.

15. The semiconductor apparatus as set forth in claim 8, wherein the reference clock signal is a signal of which the first clock signal is divided by n where n is an integer of 2 or more.

16. The semiconductor apparatus as set forth in claim 9, wherein the reference clock signal is a signal of which the first clock signal is divided by n where n is an integer of 2 or more.

17. The semiconductor apparatus as set forth in claim 10, wherein the reference clock signal is a signal of which the first clock signal is divided by n where n is an integer of 2 or more.

18. The semiconductor apparatus as set forth in claim 11, wherein the reference clock signal is a signal of which the first clock signal is divided by n where n is an integer of 2 or more.

19. The semiconductor apparatus as set forth in claim 12, wherein the reference clock signal is a signal of which the first clock signal is divided by n where n is an integer of 2 or more.

20. The semiconductor apparatus as set forth in claim 13, wherein the reference clock signal is a signal of which the first clock signal is divided by n where n is an integer of 2 or more.

21. The semiconductor apparatus as set forth in claim 14, wherein the reference clock signal is a signal of which the first clock signal is divided by n where n is an integer of 2 or more.

22. The semiconductor apparatus as set forth in one of claim 1,
wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor,
wherein when said voltage raising circuit raises the power supply voltage, said first P channel transistor and said third P channel transistor are turned on and said second P channel transistor and said first N channel transistor are turned off, and
wherein when said voltage raising circuit does not raise the power supply voltage, said second P channel transistor and said first N channel transistor are turned on and said first P channel transistor and said third P channel transistor are turned off.

23. The semiconductor apparatus as set forth in one of claim 2,
wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor,
wherein when said voltage raising circuit raises the power supply voltage, said first P channel transistor and said third P channel transistor are turned on and said second P channel transistor and said first N channel transistor are turned off, and
wherein when said voltage raising circuit does not raise the power supply voltage, said second P channel transistor and said first N channel transistor are turned on and said first P channel transistor and said third P channel transistor are turned off.

24. The semiconductor apparatus as set forth in one of claim 3,
wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

25. The semiconductor apparatus as set forth in one of claim 4, wherein said voltage raising circuit comprises:

a first P channel transistor whose source is connected to a first lead of a first capacitor;

a second P channel transistor whose source is connected to the drain of said first P channel transistor and a first lead of the second capacitor;

a third P channel transistor whose source is connected to the drain of said second P channel transistor and a power supply; and a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

26. The semiconductor apparatus as set forth in one of claim 5, wherein said voltage raising circuit comprises:

a first P channel transistor whose source is connected to a first lead of a first capacitor;

a second P channel transistor whose source is connected to the drain of said first P channel transistor and a first lead of the second capacitor;

a third P channel transistor whose source is connected to the drain of said second P channel transistor and a power supply; and a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

27. The semiconductor apparatus as set forth in one of claim 6, wherein said voltage raising circuit comprises:

a first P channel transistor whose source is connected to a first lead of a first capacitor;

a second P channel transistor whose source is connected to the drain of said first P channel transistor and a first lead of the second capacitor;

a third P channel transistor whose source is connected to the drain of said second P channel transistor and a power supply; and a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

28. The semiconductor apparatus as set forth in one of claim 7, wherein said voltage raising circuit comprises:

a first P channel transistor whose source is connected to a first lead of a first capacitor;

a second P channel transistor whose source is connected to the drain of said first P channel transistor and a first lead of the second capacitor;

a third P channel transistor whose source is connected to the drain of said second P channel transistor and a power supply; and a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

29. The semiconductor apparatus as set forth in one of claim 8, wherein voltage raising circuit comprises:

a first P channel transistor whose source is connected to a first lead of a first capacitor;

a second P channel transistor whose source is connected to the drain of said first P channel transistor and a first lead of the second capacitor;

a third P channel transistor whose source is connected to the drain of said second P channel transistor and a power supply; and a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

30. The semiconductor apparatus as set forth in one of claim 9, wherein said voltage raising circuit comprises:

a first P channel transistor whose source is connected to a first lead of a first capacitor;

a second P channel transistor whose source is connected to the drain of said first P channel transistor and a first lead of the second capacitor;

a third P channel transistor whose source is connected to the drain of said second P channel transistor and a power supply; and a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

31. The semiconductor apparatus as set forth in one of claim 10, wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

32. The semiconductor apparatus as set forth in one of claim 11, wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

33. The semiconductor apparatus as set forth in one of claim 12, wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

34. The semiconductor apparatus as set forth in one of claim 13, wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

35. The semiconductor apparatus as set forth in one of claim 14, wherein said voltage raising circuit comprises:
a first P channel transistor whose source is connected to a first lead of a first capacitor;
a second P channel transistor whose source is connected to the drain of said first P channel transistor and a first lead of the second capacitor;
a third P channel transistor whose source is connected to the drain of said second P channel transistor and a power supply; and
a first N channel transistor whose drain is connected to the drain of said third P channel transistor and a second lead of the second capacitor, wherein when said voltage raising circuit raises the power supply voltage, said first P channel transistor and said third P channel transistor are turned on and said second P channel transistor and said first N channel transistor are turned off, and wherein when said voltage raising circuit does not raise the power supply voltage, said second P channel transistor and said first N channel transistor are turned on and said first P channel transistor and said third P channel transistor are turned off.

* * * * *